United States Patent
Chung et al.

(10) Patent No.: US 12,044,975 B2
(45) Date of Patent: *Jul. 23, 2024

(54) EXTREME ULTRAVIOLET CONTROL SYSTEM

(71) Applicant: TAIWAN SEMICONDUCTOR MANUFACTURING COMPANY, LTD., Hsinchu (TW)

(72) Inventors: Jen-Yang Chung, Penghu County (TW); Chieh Hsieh, Taoyuan (TW); Shang-Chieh Chien, New Taipei (TW); Li-Jui Chen, Hsinchu (TW); Po-Chung Cheng, Longxing Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/963,054

(22) Filed: Oct. 10, 2022

(65) Prior Publication Data

US 2023/0030134 A1 Feb. 2, 2023

Related U.S. Application Data

(63) Continuation of application No. 17/222,109, filed on Apr. 5, 2021, now Pat. No. 11,467,498, which is a
(Continued)

(51) Int. Cl.
*G03F 7/00* (2006.01)
*G03F 1/24* (2012.01)
(Continued)

(52) U.S. Cl.
CPC .......... *G03F 7/70033* (2013.01); *G03F 1/24* (2013.01); *G03F 7/2004* (2013.01); *H05G 2/003* (2013.01); *H05G 2/008* (2013.01)

(58) Field of Classification Search
CPC ...... G03F 7/70033; G03F 7/2004; G03F 1/24; H05G 2/003; H05G 2/008
See application file for complete search history.

(56) References Cited

U.S. PATENT DOCUMENTS

| 7,164,144 B2 | 1/2007 | Partlo et al. |
| 8,324,600 B2 | 12/2012 | Hayashi et al. |
| (Continued) | | |

OTHER PUBLICATIONS

Non-Final Office Action issued in related U.S. Appl. No. 16/029,408, dated Dec. 5, 2019.
(Continued)

*Primary Examiner* — Nicole M Ippolito
*Assistant Examiner* — Hanway Chang
(74) *Attorney, Agent, or Firm* — STUDEBAKER & BRACKETT PC

(57) ABSTRACT

A method of controlling a droplet illumination module/droplet detection module system of an extreme ultraviolet (EUV) radiation source includes irradiating a target droplet with light from a droplet illumination module and detecting light reflected and/or scattered by the target droplet. The method includes determining whether an intensity of the detected light is within an acceptable range. In response to determining that the intensity of the detected light is not within the acceptable range, a parameter of the droplet illumination module is automatically adjusted to set the intensity of the detected light within the acceptable range.

20 Claims, 7 Drawing Sheets

Related U.S. Application Data continuation of application No. 16/029,408, filed on Jul. 6, 2018, now Pat. No. 10,969,690.

(60) Provisional application No. 62/565,802, filed on Sep. 29, 2017.

(51) Int. Cl.
  *G03F 7/20* (2006.01)
  *H05G 2/00* (2006.01)

(56) References Cited

U.S. PATENT DOCUMENTS

| | | | |
|---|---|---|---|
| 8,461,560 B2 | 6/2013 | Ershov et al. |
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,265,136 B2 | 2/2016 | Hori et al. |
| 9,497,840 B2 | 11/2016 | Wehrens |
| 9,529,268 B2 | 12/2016 | Chang et al. |
| 9,548,303 B2 | 1/2017 | Lee et al. |
| 9,618,837 B2 | 4/2017 | Lu et al. |
| 9,832,853 B2 | 11/2017 | Graham et al. |
| 9,869,928 B2 | 1/2018 | Huang et al. |
| 9,869,934 B2 | 1/2018 | Huang et al. |
| 9,869,939 B2 | 1/2018 | Yu et al. |
| 10,969,690 B2 * | 4/2021 | Chung .................. H05G 2/003 |
| 2006/0002113 A1 | 1/2006 | Chandhok et al. |
| 2007/0007469 A1 | 1/2007 | Murakami et al. |
| 2012/0062864 A1 | 3/2012 | Kawabe |
| 2012/0305811 A1 | 12/2012 | Wakabayashi et al. |
| 2014/0084183 A1 | 3/2014 | Wakabayashi et al. |
| 2016/0073487 A1 | 3/2016 | Yanagida et al. |
| 2017/0250517 A1 | 8/2017 | Suzuki et al. |
| 2017/0325325 A1 | 11/2017 | Lambert et al. |
| 2017/0336282 A1 | 11/2017 | Kobayashi et al. |

OTHER PUBLICATIONS

Final Office Action issued in related U.S. Appl. No. 16/029,408, dated Jun. 29, 2020.

Notice of Allowance issued in related U.S. Appl. No. 16/029,408, dated Dec. 2, 2020.

Notice of Allowance issued in related U.S. Appl. No. 17/222,109, dated Jun. 8, 2022.

* cited by examiner

EXTREME ULTRAVIOLET CONTROL SYSTEM

RELATED APPLICATIONS

This application is a continuation application of U.S. patent application Ser. No. 17/222,109 filed on Apr. 5, 2021, now U.S. Pat. No. 11,467,498, which is a continuation application of U.S. patent application Ser. No. 16/029,408, filed on Jul. 6, 2018 now U.S. Pat. No. 10,969,690, which claims the priority of U.S. Provisional Application No. 62/565,802 filed on Sep. 29, 2017, the entire contents of each of which application are incorporated herein by reference.

TECHNICAL FIELD

The disclosure relates to extreme ultraviolet (EUV) light source light source systems, and in particular to a system for controlling the timing of a laser beam in an EUV source based on laser-produced plasma.

BACKGROUND

The wavelength of radiation used for lithography in semiconductor manufacturing has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

One method for producing EUV radiation is laser-produced plasma (LPP). In an LPP-based EUV source, a high-power laser beam is focused on small droplet targets of metal, such as tin, to form a highly ionized plasma that emits EUV radiation with a peak maximum emission at 13.5 nm. The intensity of the EUV radiation produced by LPP depends on the effectiveness with which the high-powered laser can produce the plasma from the droplet targets. Precise synchronization of the pulses of the high-powered laser with generation and movement of the droplet targets is desired to improve the efficiency of an LPP-based EUV radiation source.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
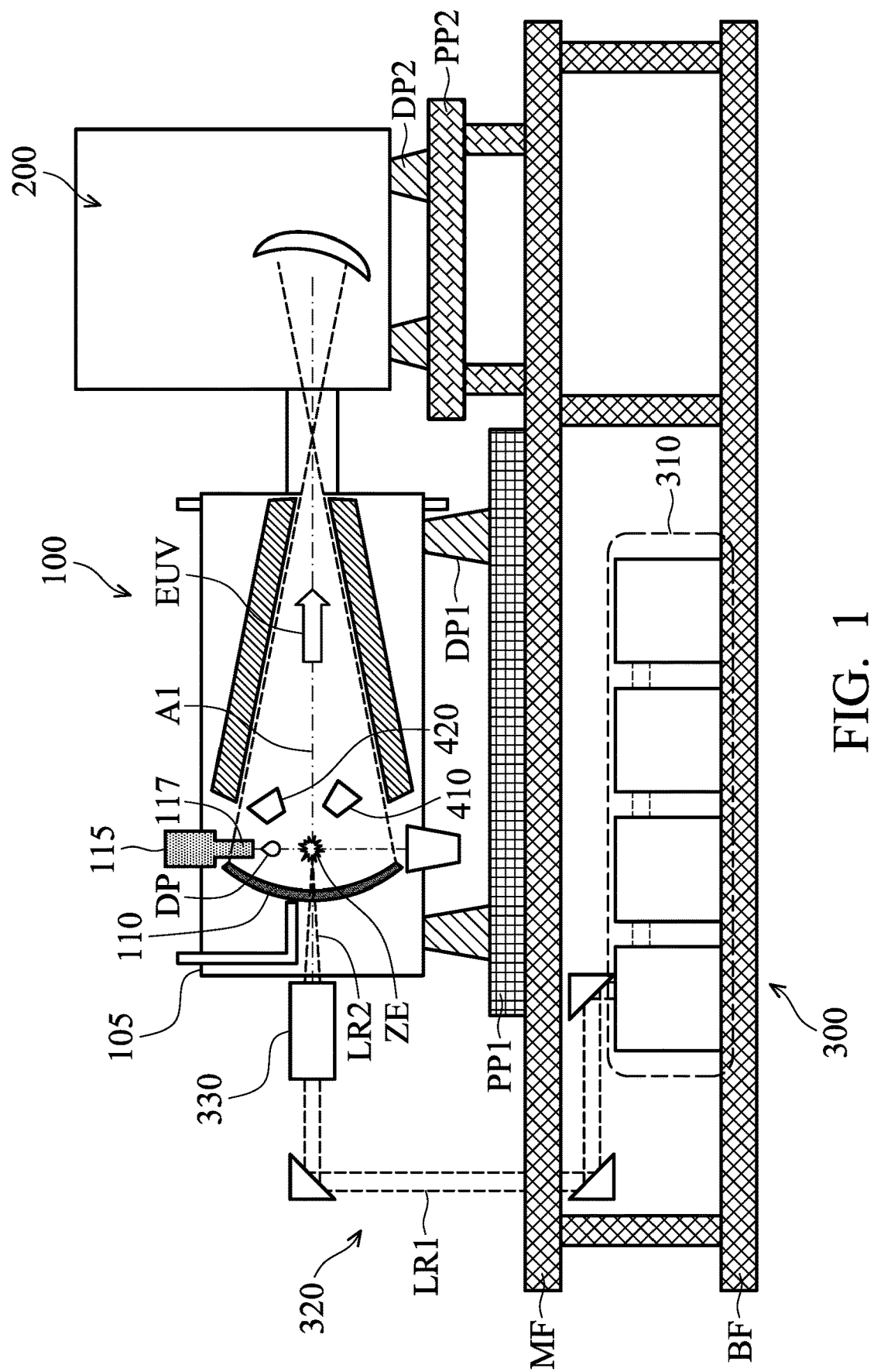
FIG. 1 is a schematic view of an EUV lithography system with a laser produced plasma (LPP) EUV radiation source in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to extreme ultraviolet (EUV) lithography system and methods. More particularly, it is related to apparatuses and methods for controlling an excitation laser used in a laser produced plasma (LPP)-based EUV radiation source. The excitation laser heats metal (e.g., tin) target droplets in the LPP chamber to ionize the droplets to a plasma which emits the EUV radiation. For optimum heating of the target droplets, the target droplets have to arrive at the focal point of the excitation laser at the same time as an excitation pulse from the excitation laser. Thus, synchronization between the target droplets and trigger time for triggering an excitation pulse from the excitation layer contributes to efficiency and stability of the LPP EUV radiation source.

Droplet illumination modules and droplet detection modules are used to measure the speed of target droplets. The droplet illumination module (DIM) directs light to the target droplet and the reflected and/or scattered light is detected by the droplet detection module (DDM). The signal then passes to a timing energy measurement module (TEM2) for Tfire (pre-pulse) fire time determination. Embodiments of the present disclosure are directed to controlling droplet illumination and detection for accurately measuring the speed of the target droplets.

FIG. 1 is a schematic view of an EUV lithography system with a LPP-based EUV radiation source, in accordance with some embodiments of the present disclosure. The EUV lithography system includes an EUV radiation source 100 to generate EUV radiation, an exposure tool 200, such as a scanner, and an excitation laser source 300. As shown in FIG. 1, in some embodiments, the EUV radiation source 100 and the exposure tool 200 are installed on a main floor MF of a clean room, while the excitation laser source 300 is installed in a base floor BF located under the main floor. Each of the EUV radiation source 100 and the exposure tool 200 are placed over pedestal plates PP1 and PP2 via dampers DP1 and DP2, respectively. The EUV radiation source 100 and the exposure tool 200 are coupled to each other by a coupling mechanism, which may include a focusing unit.

The lithography system is an extreme ultraviolet (EUV) lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optical components, such as convex/concave/flat mirrors, a mask holding mechanism including a mask stage, and wafer holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. In an embodiment, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP collector 110, enclosed by a chamber 105. The target droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The laser light LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure tool 200.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp}=d/(t_{rad}-t_o)\text{-Equation (1).}$$

Because the droplet generator is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In embodiments where the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

Figure 2A:
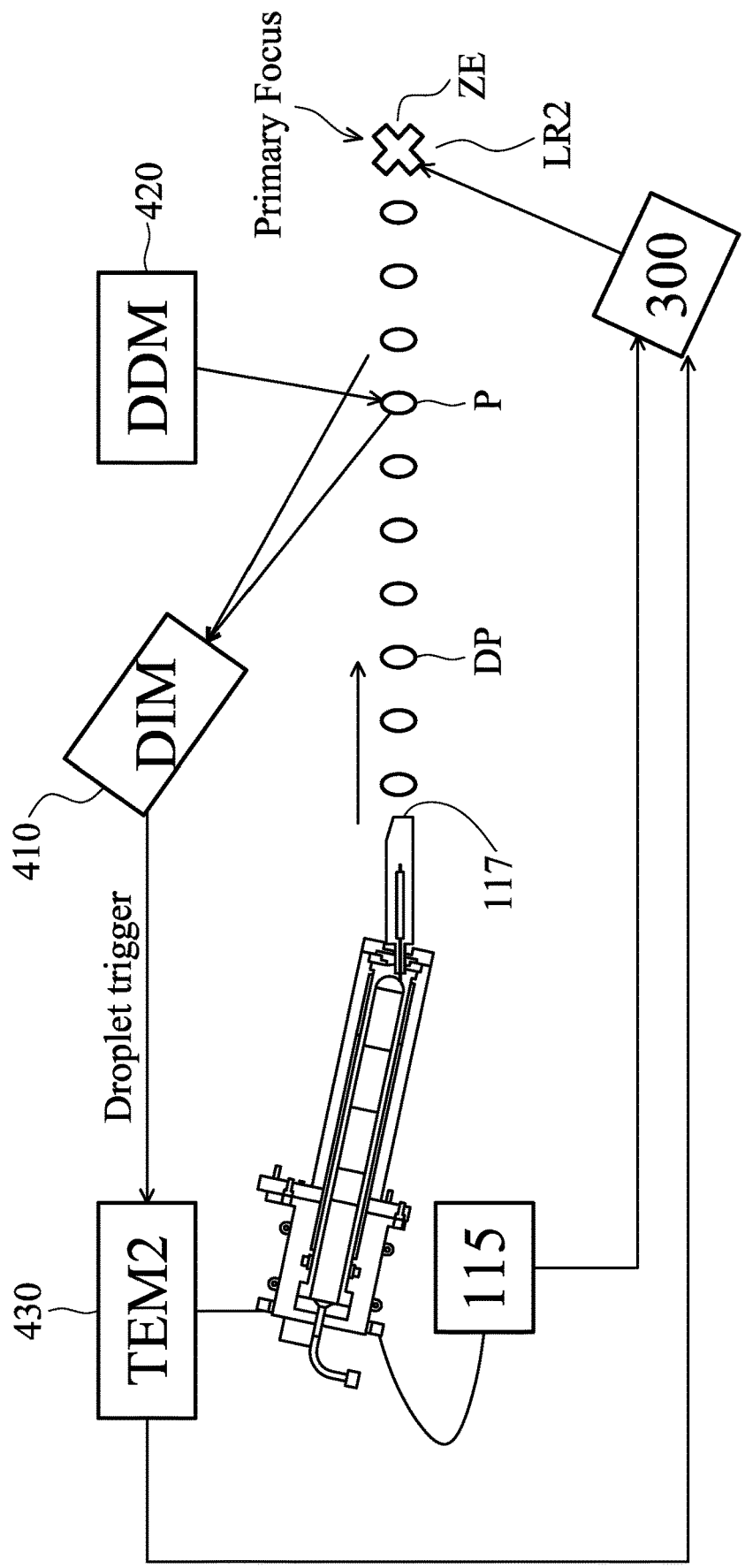
FIG. 2A schematically illustrates a device for synchronizing the generation of excitation pulses with the arrival of the target droplets in the zone of excitation in accordance with an embodiment of the present disclosure.

FIG. 2A schematically illustrates a device for synchronizing the generation of excitation pulses with the arrival of the target droplets in the zone of excitation used in the EUV lithography system illustrated in FIG. 1, in accordance with an embodiment. In an embodiment, a droplet illumination module 410 is used for illuminating a target droplet DP ejected from the nozzle 117. The droplet illumination module 410 is focused at a fixed position P along the path of the target droplet DP from the nozzle 117 to the zone of excitation ZE. One of ordinary skill in the art will appreciate that once the excitation laser hits the target droplet DP within the zone of excitation ZE, the plasma formed because of ionization of the target droplet DP expands rapidly to a volume that is dependent on the size of the target droplet and the energy provided by the excitation laser. In various embodiments, the plasma expands several hundred microns from the zone of excitation ZE. As used herein, the term "expansion volume" refers to a volume to which plasma expands after the target droplets are heated with the excitation laser. Thus, the position P is fixed to be outside the expansion volume to avoid interference from the plasma. In an embodiment, the position P is fixed at a known distance, d, of several millimeters away from the zone of excitation ZE.

The droplet illumination module 410 is a continuous wave laser in an embodiment. In other embodiments, the droplet illumination module 410 is a pulsed laser. The wavelength of the droplet illumination module 410 is not particularly limited. In an embodiment, the droplet illumination module 410 has a wavelength in the visible region of electromagnetic spectrum. In some embodiments, the droplet illumination module 410 has a wavelength of about 1070 nm. In various embodiments, the droplet illumination module 410 has an average power in the range from about 1 W to about 50 W. For example, in an embodiment, the droplet illumination module 410 has an average power of about 1 W, about 5 W, about 10 W, about 25 W, about 40 W, about 50 W, or any average power between these values. In some embodiments, the droplet illumination module 410 generates a beam having a uniform illumination profile. For example, in an embodiment, the droplet illumination module 410 creates a fan-shaped light curtain having substantially the same intensity across its profile. The beam produced by the droplet illumination module 410 has a width of in the range of about 10 μm to about 300 μm in various embodiments.

As the target droplet DP passes through the beam generated by the droplet illumination module 410, the target droplet DP reflects and/or scatters the photons in the beam. In an embodiment, the target droplet DP produces a substantially Gaussian intensity profile of scattered photons. The photons scattered by the target droplet DP are detected by a droplet detection module 420 (interchangeably referred to herein as "droplet detector 420"). The center of the target droplet DP corresponds to the peak of the intensity profile detected at the droplet detection module 420. In some embodiments, the droplet detection module 420 is a photodiode and generates an electrical signal upon detecting the photons reflected and/or scattered by the target droplet DP. Thus, the droplet detection module 420 detects when a target droplet has passed position P.

The time, $t_o$, at which the droplet detection module 420 detects the target droplet DP passing the position P is provided to a timing and energy measurement module 430. Once the target droplet reaches the zone of excitation ZE and is heated with an excitation laser pulse LR2, the material of the target droplet is ionized into plasma, which emits EUV radiation EUV. This EUV radiation is detected by the timing and energy measurement module 430.

In an embodiment, the timing and energy measurement module 430 includes a detector configured to detect the EUV power generated at each instance of plasma generation. The detector includes a photodiode or a filtered photodiode configured to convert the energy from photons incident on it into an electrical signal in some embodiments. In an embodiment, the detector also includes a mirror that reflects the EUV radiation from a fixed position in the exposure tool on to the photodiode.

The timing and energy measurement module 430, in an embodiment, is configured to estimate the time at which the power of the EUV radiation peaks, $t_{rad}$. Speed of the target droplet, calculated using Equation (1), is then used to trigger the excitation pulse for a subsequent target droplet. Those of skill in the art would appreciate that in order to estimate the time at which EUV power peaks, it is not necessary to measure the absolute power EUV power generated at every instance of plasma generation, but the rate of change of EUV power is sufficient to estimate the precise time at which the EUV power peaks.

Speed of a target droplet is calculated based on a peak in the EUV energy, and this measurement of speed is used to trigger an excitation pulse for the next target droplet. In an embodiment, the timing and energy measurement module 430 is further configured to calculate, using Equation (1), the precise time at which the next target droplet will arrive at the zone of excitation ZE, and provide a trigger signal to the excitation laser source 300 to control the trigger time for the excitation pulse LR2.

In an embodiment, the speed of the target droplets DP supplied from the nozzle is substantially the same. In this calculation, according to this embodiment, the speed of the target droplets remains substantially the same as they travel from the nozzle to the zone of excitation. Further in this embodiment, the excitation laser is considered to be perfectly stable and that each pulse is identical in duration and energy to its preceding pulse. Additionally, in such an embodiment, the energy profile the EUV radiation emitted by the plasma is set to be substantially the same for every excitation pulse. Further, in this embodiment, the positions of the droplet illumination module and the droplet detection module are stably fixed relative to the trajectory of the target droplet. Furthermore, in such an embodiment, the intensity of the light from droplet illumination module is considered to remain constant. However, for a given target droplet, one or more of these conditions may vary.

For example, if there is a shift in position of the DIM and/or the DDM or a decay in the intensity of the DIM source the precision of the target droplet speed detection will degrade and false signals could be generated. Further, if the signal from a target droplet is too low the DDM may not detect the target droplet resulting in missing triggers for Tfire. On the other hand, if the plasma-flash signal is too intense it can cause a shift in the signal from the target droplet and lead to unstable targeting.

Figure 2B:
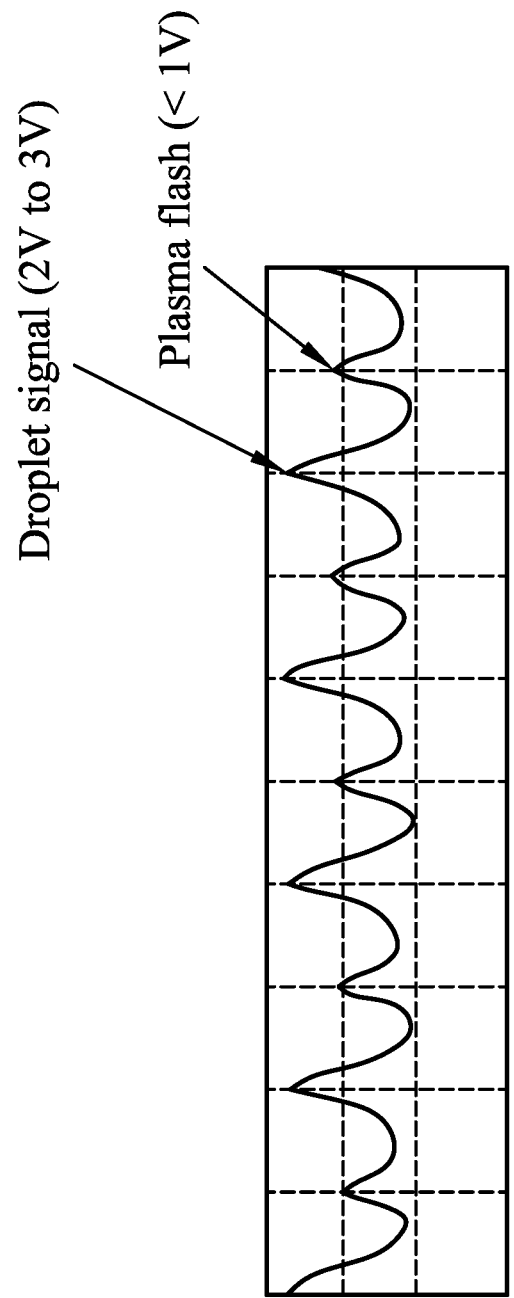
FIG. 2B illustrates a simulation of a droplet signal and a signal from the plasma flash detected at the droplet detection module.

FIG. 2B illustrates a simulation of a droplet signal and a signal from the plasma flash detected at the droplet detection module. As discussed elsewhere herein, if the signal from the plasma flash is too high, the droplet signal may either shift or the signal from the plasma flash may misinterpreted as the droplet signal, resulting in misfiring of the excitation laser. On the other hand, if the droplet signal is too low, it can be misinterpreted as the signal from the plasma flash, and a firing of the excitation laser may be missed, resulting in wasted target droplets and undesirable gaps in EUV production.

It is contemplated that controlling the droplet illumination/detection modules to enable more stable signals from target droplets improves the stability of the EUV source.

Figure 3:
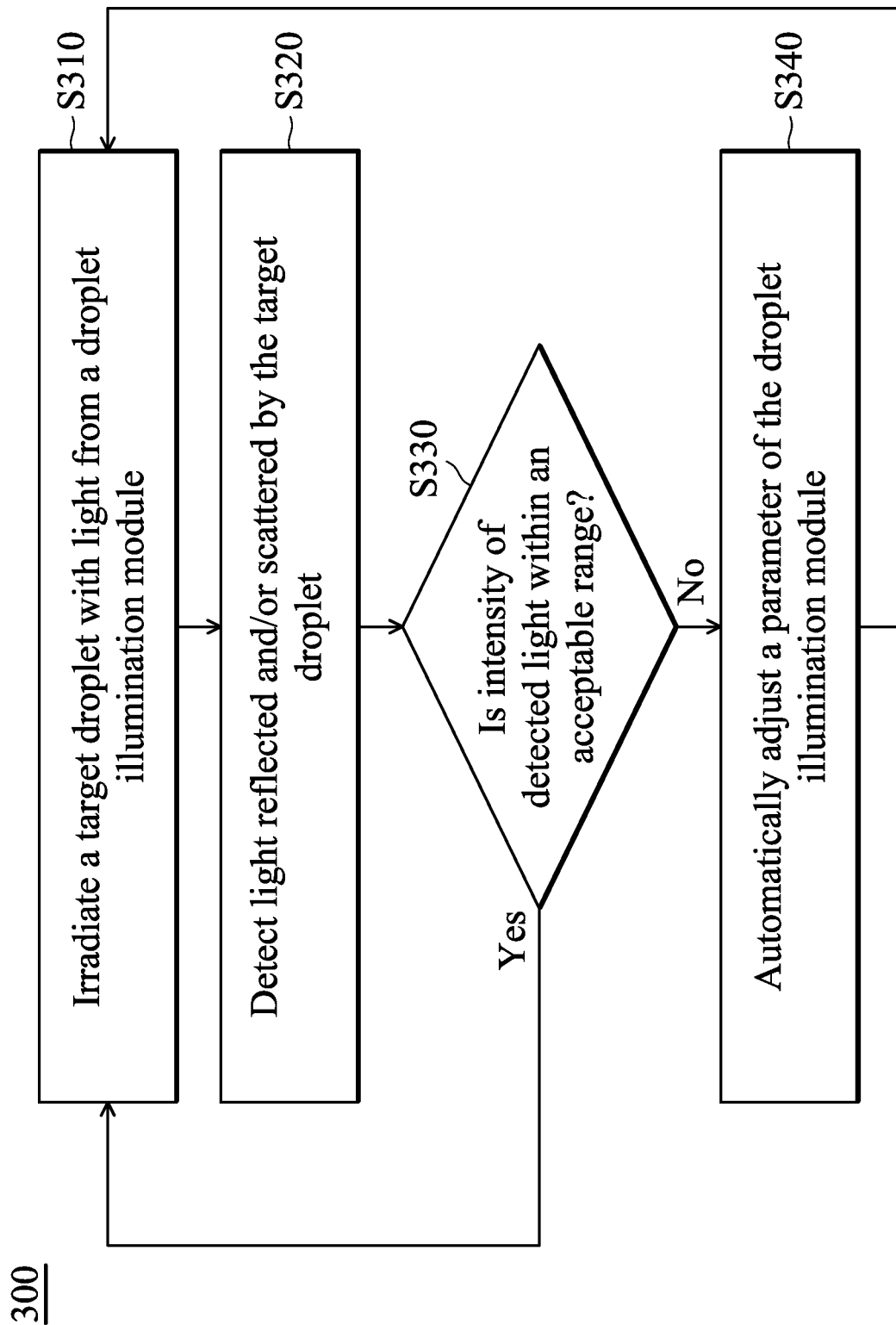
FIG. 3 illustrates a flow-chart of a method 300 of controlling the droplet illumination module/droplet detection module system of an EUV source in accordance with an embodiment of the present disclosure.

FIG. 3 illustrates a flow-chart of a method 300 of controlling the droplet illumination module/droplet detection module system of an EUV source, in accordance with an embodiment of the present disclosure. The method includes, at S310, irradiating a target droplet with light from a droplet illumination module. In various embodiments, the droplet illumination module is a continuous wave laser. In other embodiments, the droplet illumination module is a pulsed laser. The wavelength of light from the droplet illumination module is not particularly limited. In an embodiment, the droplet illumination module has a wavelength in the visible region of electromagnetic spectrum. In some embodiments, the droplet illumination module has a wavelength of about 1070 nm. In various embodiments, the droplet illumination module has an average power in the range from about 1 W to about 50 W. In some embodiments, the droplet illumination module generates a beam having a uniform illumination profile. For example, in an embodiment, the droplet illumination module creates a light curtain having substantially the same intensity across its profile. The beam produced by the droplet illumination module has a width of in the range of about 10 μm to about 300 μm in various embodiments.

As discussed elsewhere herein, the target droplet reflects and/or scatters the light incident upon it. The reflected and/or scattered light is detected, at S320, for example, at a droplet detection module. In some embodiments, the droplet detection module includes a photodiode designed to detect light having a wavelength of the light from the droplet illumination module. In some embodiments, the droplet detection module further includes one or more filters for filtering certain frequencies of light. For example, in an embodiment, the droplet detection module includes a filter for blocking EUV radiation. In another embodiment, the droplet detection module includes a filter for blocking all frequencies other than that of the light from the droplet illumination module.

At S330, it is determined whether an intensity of the detected light (i.e., light reflected and/or scattered by the target droplet) is within an acceptable range. In embodiments where the light is detected using a photodiode, the determination is based on a value of current and/or voltage produced by photodiode when it receives the light reflected and/or scattered by the target droplet. In some embodiments, the droplet detection module includes a logic circuit programmed to generate a prescribed signal when the detected intensity is not within an acceptable range. For example, a prescribed signal is generated when the detected intensity is less than a certain threshold value. The threshold value of intensity is, for example, an expected minimum intensity of light reflected and/or scattered by the target droplet that can be adequately distinguished from the plasma flash. In some embodiments, the expected minimum intensity of light reflected and/or scattered by the target droplets is determined based an average intensity for a large number of target droplets, e.g., 1,000 target droplets or 10,000 target droplets. In some embodiments, the expected minimum intensity is, for example, one standard deviation or two standard deviations less than the average intensity determined for the large number of target droplets.

If the intensity of the detected light is not within the acceptable range, at S340, a parameter of the droplet illumination module is automatically adjusted to increase or decrease the intensity of light irradiating the target droplet so as to ultimately bring the intensity of the detected light within the acceptable range.

In various embodiments, the parameter of the droplet illumination module includes, for example, an input voltage and/or current to the light source (e.g., laser) in the droplet illumination module, a width of a slit controlling the amount of light exiting the droplet illumination module, an aperture of the droplet illumination module, and a value of angle and/or tilt of the droplet illumination module. In some embodiments, the parameter is adjusted using a controller that is programmed to control various parameters of the droplet illumination module. For example, in an embodiment, the controller is coupled to a slit controlling the amount of light exiting the droplet illumination module and/or a mechanism that controls the tilt/angle of the droplet illumination module. In such embodiments the controller is coupled to the droplet detection module and adjusts the width of the slit and/or the tilt of the droplet illumination module in response to the prescribed signal generated by the droplet detection module when the intensity of the detected light is not within the acceptable range.

In some embodiments, the controller is a logic circuit programmed to receive a signal from the droplet detection module, and depending on the received signal transmit control signals to one or more components (e.g., the slit and/or tilt control mechanism described elsewhere herein) of the droplet illumination module to automatically adjust one or more parameters of the droplet illumination module.

Figure 4A:
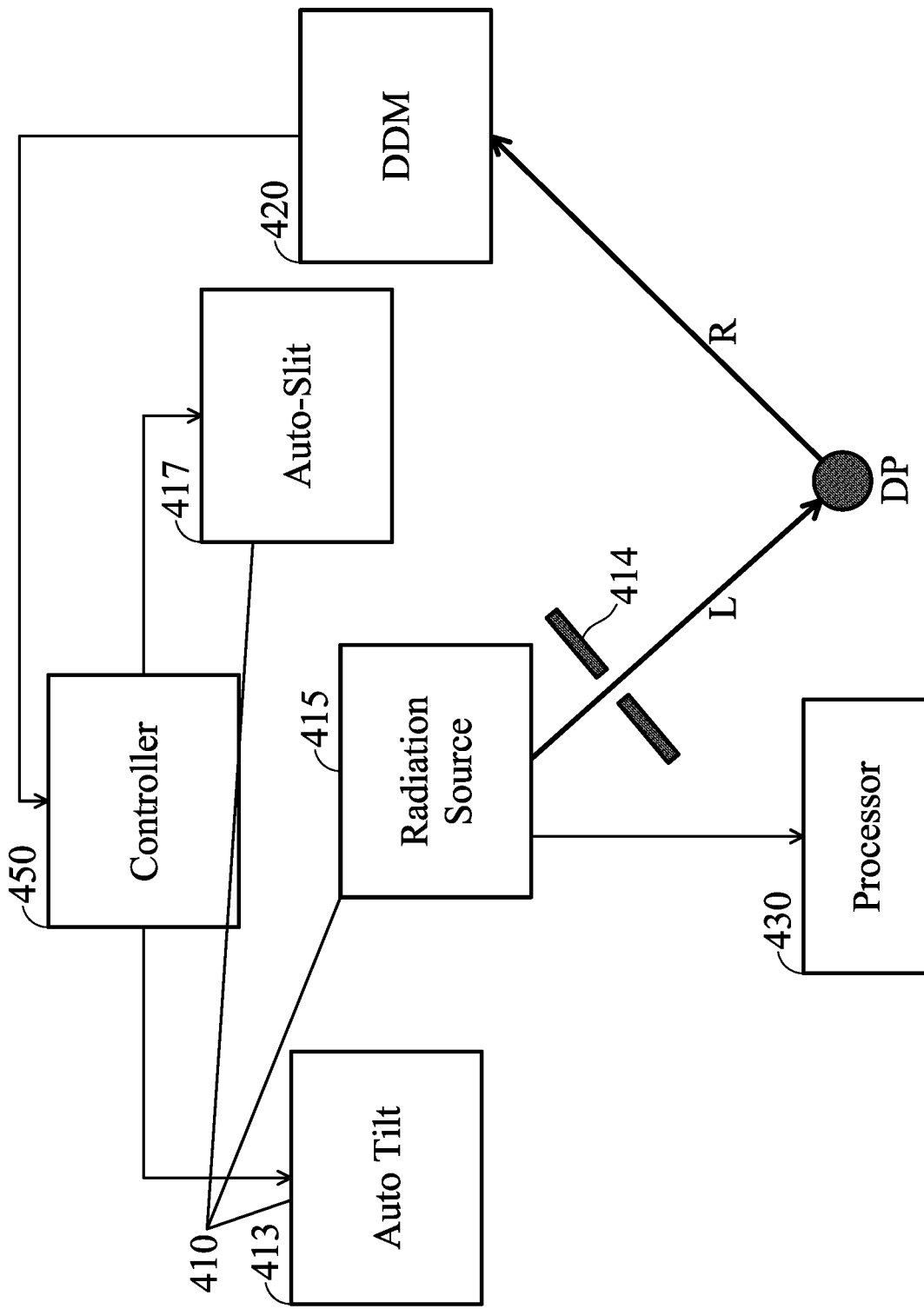
FIG. 4A schematically illustrates an apparatus for measuring a speed of a target droplet in an EUV source in accordance with an embodiment of the present disclosure.

FIG. 4A schematically illustrates an apparatus for measuring a speed of a target droplet in an EUV source, in accordance with an embodiment of the present disclosure. In an embodiment, the apparatus includes a droplet illumination module 410, a droplet detection module 420, a controller 450 and a processor 500.

In various embodiments, the droplet illumination module 410 includes a radiation source 415, a tilt control mechanism 413 and a slit control mechanism 417. The tilt control mechanism 413 (also referred to herein as "auto tilt") controls the tilt of the radiation source 415. In various embodiments, the auto tilt 413 is a stepper motor coupled to the radiation source 415 (e.g., laser) of the droplet illumination module 410 and moves the radiation source 415 to change the angle of incidence at which light (or radiation) L is incident on the target droplet DP (and in effect changing the amount of light R reflected and/or scattered by the target droplet DP into the droplet detection module 420). In some embodiments, the auto tilt 413 includes a piezoelectric actuator.

Figure 4B:
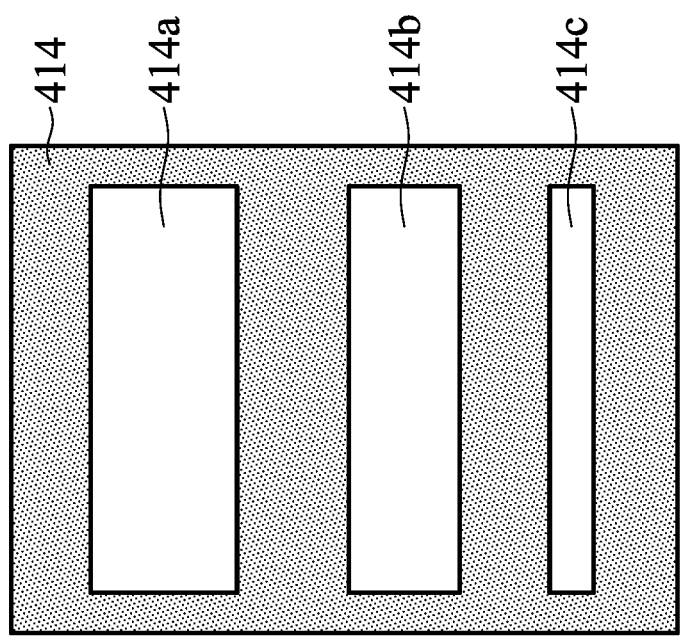
FIG. 4B is a detailed view of the slit control mechanism used in the apparatus of FIG. 4A in accordance with an embodiment of the present disclosure.

The slit control mechanism 417 (also referred to herein as "auto slit") controls the amount of light exiting the radiation source 415. In an embodiment a slit or an aperture 414 is disposed between the radiation source 415 and the position P at which the target droplet DP is irradiated. In some embodiments, as depicted in FIG. 4B, the slit control mechanism 417 includes a movable opaque barrier 414 having several slits 414a, 414b, 414c or openings of different sizes. When, for example, the controller 450 determines that the intensity of light detected at droplet detection module 420 is lower than the acceptable range, the controller 450 moves the slit control mechanism 417 such that a wider slit 414a is provided in the path of light exiting the radiation source 415, allowing more light to irradiate the target droplet DP and increasing the detected intensity. On the other hand, if it is determined that the intensity of light detected at the droplet detection unit 417 is higher than the acceptable range, the controller 450 moves the slit control mechanism 417 such that a narrower slit 414c is provided in the path of light exiting the radiation source 415, thereby reducing the detected intensity. In such embodiments, parameter of the droplet illumination module 410 adjusted by the controller 450 is the width of the slit 414 in the path of light L irradiating the target droplet.

Figure 4C:
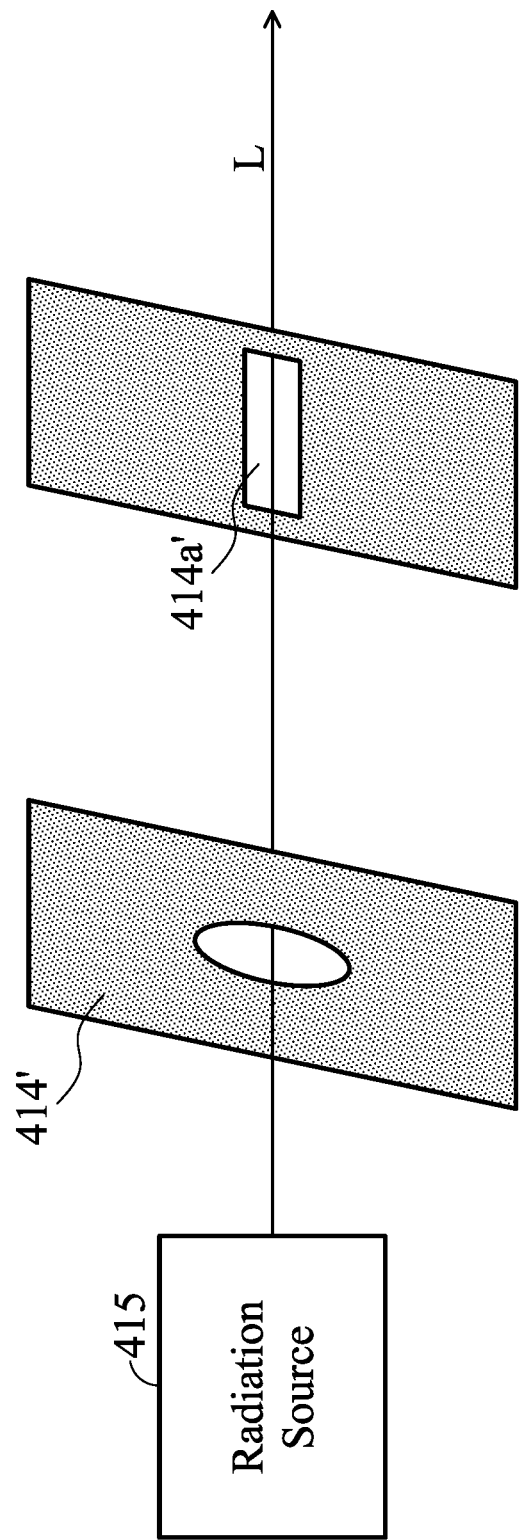
FIG. 4C is a detailed view of an alternative slit control mechanism used in the apparatus of FIG. 4A in accordance with an embodiment of the present disclosure.

In some embodiments, as depicted in FIG. 4C, the auto slit 417 includes an iris diaphragm 414' followed by a single slit 414a' disposed between the radiation source 415 and the position P. The slit control mechanism 417 in such embodiments functions by changing the total intensity of light incident on the single slit 414a' via the iris diaphragm 414'. For example, if the controller 450 determines that the detected intensity needs to be higher, the iris diaphragm 414' is actuated to increase the aperture size, thereby allowing more light to pass through the single slit 414a' and resulting in increase in the detected intensity. On the other hand, if the detected intensity needs to be reduced, the controller 450 actuates the iris diaphragm 414' to reduce the aperture size resulting, ultimately, in reduction in the detected intensity. In such embodiments, parameter of the droplet illumination module 410 adjusted by the controller 450 is the aperture of the iris diaphragm 414' in the path of light L irradiating the target droplet DP.

Those of skill in the art will note that while the auto tilt 413 and auto slit 417 are depicted in the FIG. 4A as being separate from the radiation source 415, the auto tilt 413 and the auto slit 417 can be integrated with the radiation source 415 to form a single droplet detection module 410 in some embodiments. In such embodiments, the coupling between the controller 450 and the droplet illumination module 410 can be suitably modified to effectuate the same result as disclosed herein.

The controller 450, thus, sets the intensity of light detected at the droplet detection module 420 to enable a stable detection of target droplets over a duration of time. A time difference between detection of a given target droplet and the detection of peak EUV produced by the immediately preceding target droplet provides, as discussed elsewhere herein, the speed at which the target droplets traverse between the position P and the zone of excitation ZE. An accurate measurement of the speed of target droplets is important for stable production of EUV radiation because it allows synchronization between the arrival of the target droplet and the excitation pulse at the zone of excitation. In an embodiment, a processor 430 (also referred to herein as "timing and energy measurement module" or "TEM2") measures the speed of the target droplets as the controller 450 sets the detected intensity.

In the present disclosure, by automatically optimizing the droplet illumination/detection modules, it is possible to improve the measurement of speed of target droplets and improve synchronization between excitation pulses and the target droplets. Thus, it is possible to improve the efficiency and stability of an LPP based EUV source.

It will be understood that not all advantages have been necessarily discussed herein, no particular advantage is required for all embodiments or examples, and other embodiments or examples may offer different advantages.

According to one aspect of the present disclosure, a method of controlling a droplet illumination module/droplet detection module system of an extreme ultraviolet (EUV) radiation source includes irradiating a target droplet with light from a droplet illumination module and detecting light reflected and/or scattered by the target droplet. The method includes determining whether an intensity of the detected light is within an acceptable range. In response to determining that the intensity of the detected light is not within the acceptable range, a parameter of the droplet illumination module is automatically adjusted to set the intensity of the detected light within the acceptable range. In some embodiments, the light irradiating the target droplet has a wavelength of about 1070 nm. In some embodiments, a source of light from the droplet illumination module is a laser. In some embodiments, the parameter is a slit width of a slit positioned between the droplet illumination module and the target droplet. In some embodiments, the parameter is a tilt angle of the droplet illumination module. In some embodiments, the acceptable range of intensity includes a minimum threshold intensity. In some embodiments, a controller determines whether the detected light is within an acceptable range of intensity, and automatically controls adjusting a parameter of the droplet illumination module/droplet detection module system to set the intensity of the detected light within the acceptable range.

According to another aspect of the present disclosure, an apparatus for measuring a speed of a target droplet in an extreme ultraviolet (EUV) source includes a droplet illumination module. The droplet illumination module includes a radiation source configured to irradiate the target droplet at a prescribed position. A droplet detection module is configured to detect radiation reflected and/or scattered by the target droplet. A controller coupled to the droplet illumination module is programmed to determine whether the intensity of radiation detected at the droplet detection module is within an acceptable range of intensity and automatically adjust, in response to a determination that the detected intensity is not within an acceptable range, a parameter of the droplet illumination module. A processor is configured to determine the speed of the target droplet based on a timing of detection of radiation at the droplet detection module. In some embodiments, the droplet illumination module includes an adjustable slit through which radiation from the radiation source passes, and wherein the parameter is a slit width of the adjustable slit. In some embodiments, the droplet illumination module further comprises an automatic tilt mechanism coupled to the radiation source, and wherein the parameter is a tilt angle of the radiation source. In some embodiments, the processor is configured to determine the speed of the target droplet further based on an intensity of EUV radiation produced by the EUV source. In some embodiments, the radiation source comprises a laser. In some embodiments, the radiation from the radiation source has a wavelength of about 1070 nm. In some embodiments, the controller is programmed to automatically adjust the parameter so the intensity of radiation detected at the droplet detection module is set within the acceptable range.

According to yet another aspect of the present disclosure, an apparatus for generating extreme ultraviolet (EUV) radiation includes a droplet generator configured to generate target droplets. A droplet illumination module includes a radiation source configured to irradiate the target droplet at a prescribed position, an adjustable aperture through which radiation from the radiation source passes, and an automatic tilt mechanism coupled to the radiation source. A droplet detection module is configured to detect radiation reflected and/or scattered by the target droplet. A controller is programmed to determine whether the intensity of radiation detected at the droplet detection module is within an acceptable range, and automatically adjust, in response to a determination that the detected intensity is not within an acceptable range, a parameter of the droplet illumination module. In some embodiments, the parameter is an opening of the adjustable aperture. In some embodiments, the parameter is a tilt angle of the radiation source. In some embodiments, the radiation source is a laser. In some embodiments, the radiation from the radiation source has a wavelength of about 1070 nm. In some embodiments, the controller is programmed to automatically adjust the parameter so the intensity of radiation detected at the droplet detection module is set within the acceptable range.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of controlling an extreme ultraviolet (EUV) radiation source, the method comprising:
   irradiating a target droplet with light from a droplet illumination module (DIM) before the target droplet is irradiated with an excitation laser;
   detecting light reflected and/or scattered by the target droplet;
   determining whether an intensity of the detected light is within an acceptable range; and
   if it is determined that the intensity of the detected light is not within the acceptable range of intensity, automatically adjusting a parameter of the droplet illumination module to set the intensity of detected light within the acceptable range,
   wherein the parameter comprises a tilt angle of the droplet illumination module.

2. The method according to claim 1, wherein the light irradiating the target droplet has a wavelength of about 1070 nm.

3. The method according to claim 1, wherein a source of the light from the droplet illumination module is a laser.

4. The method according to claim 1, wherein the parameter further comprises a slit width of a slit positioned between the droplet illumination module and the target droplet.

5. The method according to claim 1, wherein the tilt angle of the droplet illumination module is adjusted by a piezoelectric actuator.

6. The method according to claim 1, wherein the acceptable range of intensity includes a minimum threshold intensity.

7. The method according to claim 1, wherein a controller determines whether the detected light is within the acceptable range of intensity, and controls the automatic adjustment of the parameter of the droplet illumination module to set the intensity of the detected light within the acceptable range.

8. An extreme ultraviolet (EUV) source apparatus, comprising:
   an excitation laser;
   a droplet illumination module comprising a radiation source configured to irradiate a target droplet at a prescribed position, and separately provided from the excitation laser;
   a droplet detection module configured to detect radiation reflected and/or scattered by the target droplet; and
   a controller coupled to the droplet illumination module and programmed to:
      determine whether an intensity of radiation detected at the droplet detection module is within an acceptable range of intensity,
      automatically adjust, in response to a determination that the detected intensity is not within the acceptable range, a parameter of the droplet illumination module, and a processor configured to determine a speed of the target droplet based on a timing of detection of radiation at the droplet detection module, wherein the parameter comprises a tilt angle of the droplet illumination module.

9. The apparatus of claim 8, wherein the droplet illumination module further comprises an adjustable slit through which radiation from the radiation source passes, and wherein the parameter further comprises a slit width of the adjustable slit.

10. The apparatus of claim 8, wherein the droplet illumination module further comprises an automatic tilt mechanism coupled to the radiation source, and the tilt angle of the droplet illumination module is adjusted by using the automatic tilt mechanism.

11. The apparatus of claim 8, the processor is configured to determine the speed of the target droplet further based on an intensity of an EUV radiation produced by the EUV source.

12. The apparatus of claim 8, wherein the excitation laser is a $CO_2$ laser.

13. The apparatus of claim 8, wherein the radiation from the radiation source has a wavelength of about 1070 nm.

14. The apparatus of claim 8, wherein the controller is programmed to automatically adjust the parameter of the droplet illumination module so the intensity of radiation detected at the droplet detection module is within the acceptable range.

15. An apparatus for generating extreme ultraviolet (EUV) radiation comprising:
an excitation laser;
a droplet generator configured to generate target droplets;
a droplet illumination module, separately provided from the excitation laser, comprising
a radiation source configured to irradiate the target droplets at a prescribed position;
an automatic tilt mechanism coupled to the radiation source; and
a droplet detection module configured to detect radiation reflected and/or scattered by the target droplets; and
a controller coupled to the droplet illumination module and programmed to:
determine whether an intensity of radiation detected at the droplet detection module is within an acceptable range, and
automatically adjust, in response to a determination that the detected intensity is not within the acceptable range, a parameter of the droplet illumination module, wherein the parameter comprises a tilt angle of the droplet illumination module.

16. The apparatus of claim 15, wherein the excitation laser is a $CO_2$ laser.

17. The apparatus of claim 15, wherein the radiation from the radiation source has a wavelength of about 1070 nm.

18. The apparatus of claim 15, wherein the automatic tilt mechanism includes a piezoelectric actuator.

19. The apparatus of claim 15, wherein the droplet illumination module further comprises an adjustable aperture through which radiation from the radiation source passes, and the parameter further includes an opening of the adjustable aperture.

20. The apparatus of claim 15, wherein the controller is programmed to automatically adjust the parameter so the intensity of radiation detected at the droplet detection module is within the acceptable range.

* * * * *